(12) United States Patent
Mruz et al.

(10) Patent No.: US 7,046,101 B2
(45) Date of Patent: May 16, 2006

(54) SWITCHABLE RF POWER DIVIDER/COMBINER WITH SWITCHABLE IMPEDANCE MATCHING ELEMENTS

(75) Inventors: John R. Mruz, New York, NY (US); Richard Palker, New York, NY (US)

(73) Assignee: L-3 Communications, Hauppauge, NY (US)

( * ) Notice: Subject to any disclaimer, the term of this patent is extended or adjusted under 35 U.S.C. 154(b) by 50 days.

(21) Appl. No.: 09/896,171

(22) Filed: Jun. 29, 2001

(65) Prior Publication Data

US 2003/0001668 A1 Jan. 2, 2003

(51) Int. Cl.
*H01P 5/12* (2006.01)
*H01P 1/10* (2006.01)

(52) U.S. Cl. ............... 333/101; 333/105; 333/125

(58) Field of Classification Search ........... 333/101, 333/105, 125, 127
See application file for complete search history.

(56) References Cited

U.S. PATENT DOCUMENTS

| 2,997,675 | A | | 8/1961 | Anderson |
| 3,694,775 | A | | 9/1972 | Rogers |
| 4,167,714 | A | * | 9/1979 | Flora ............... 333/105 X |
| 4,697,056 | A | | 9/1987 | Hoffman |
| 5,767,755 | A | | 6/1998 | Kim et al. |
| 5,872,491 | A | * | 2/1999 | Kim et al. ........... 333/105 X |
| 6,323,742 | B1 | * | 11/2001 | Ke ....................... 333/127 |

OTHER PUBLICATIONS

Product specification, for KSCSU4W4-3A from KMW, May 1998.

* cited by examiner

*Primary Examiner*—Benny Lee
(74) *Attorney, Agent, or Firm*—Baker Botts L.L.P.

(57) ABSTRACT

An RF signal divider/combiner is provided for dividing a supplied RF signal to any number of up to N output ports. A switchable impedance matching network is provided to impedance match the divider according to the number of output ports connected.

3 Claims, 6 Drawing Sheets

SWITCHABLE RF POWER DIVIDER/COMBINER WITH SWITCHABLE IMPEDANCE MATCHING ELEMENTS

BACKGROUND OF INVENTION

The present invention relates to radio frequency (RF) power dividers/combiners, and particularly to a novel switchable power divider/combiner.

Power dividers are known to be functional for dividing a single RF signal into multiple RF signals or, reciprocally, for combining a plurality of phase-coherent RF signals into a single output RF signal. Such known power dividers/combiners are arranged with a fixed number of input/output ports and are designed to accommodate the fixed number of input/output ports.

Single-pole, N-throw RF switches are also known, for connecting a single common port to one of N output ports. Such switches usually connect only a single output port to the input port at any time, other than for brief intervals during switching.

It is an object of the present invention to provide an arrangement for a switchable RF signal divider/combiner which has impedance matched inputs and outputs. It is a further object of the invention to provide systems, such as RF power amplifiers, using one or more power combiners/dividers in accordance with the invention.

SUMMARY OF THE INVENTION

In accordance with the invention there is provided an RF signal divider/combiner comprising a single pole, N-Throw RF switch, where N is an integer of 3 or more. The switch is operable to connect up to N individual ports carrying RF signals to a common port. There is further provided a switchable impedance matching network having at least N−1 switch selectable matching elements which is arranged to provide selected impedance matching for the N-way RF switch according to the number of individual ports that are connected to the common port by the switch.

In a preferred embodiment the switch includes a planar inner conductor in an RF cavity, connected to the common port at one end and having a switch contact at a second end. A plurality of N switch reeds are moveable by electromagnets for selectively connecting the switch of the inner conductor to any of the individual ports. There is further provided at least N−1 impedance matching switch reed for selecive connection to the planar inner conductor, In accordance with the invention, an RF power amplifier is provided having a switchable RF power divider connected between an input port and a plurality power amplifiers and a switchable RF power combiner for selectively connecting the output of the power amplifiers to an RF output port.

For a better understanding of the present invention, together with other and further objects, reference is made to the following description, taken in conjunction with the accompanying drawings, and its scope will be pointed out in the appended claims.

DESCRIPTION OF THE PREFERRED EMBODIMENT

In connection with the present invention reference will generally be made to RF power dividers, it being understood that such dividers are reciprocal device and equally useful as power combiners. Accordingly, the term dividers should be construed to encompass devices applied as either dividers or combiners.

Figure 1:
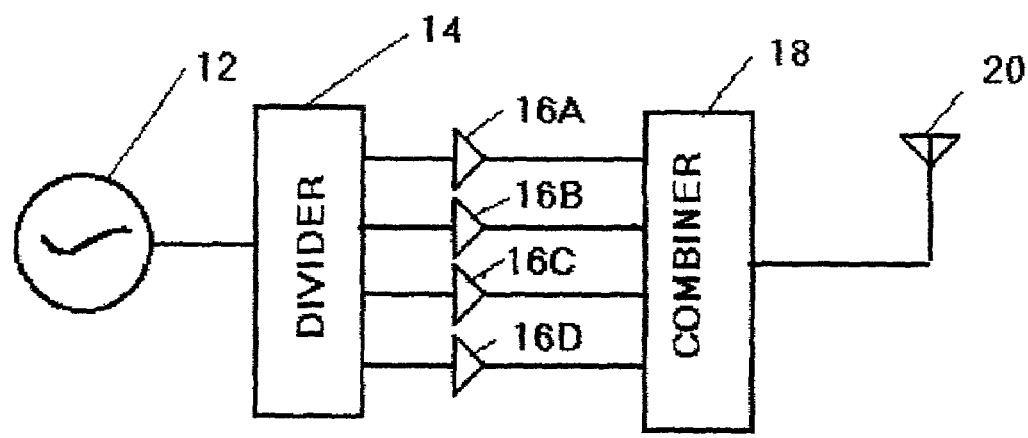
FIG. 1 is a block diagram showing an RF system having multiple parallel RF amplifiers.

FIG. 1 is a block diagram of a system which includes parallel power amplifiers 16 which receive coherent RF signals, generated by signal source 12 and divided in equal amplitude and phase relation by RF divider 14. The output signals from RF amplifiers 16A, 16B, 16C and 16D are provided to combiner 18 and thereafter to antenna 20.

Those familiar with RF circuits will recognize that in a conventional system of the type shown in FIG. 1, proper operation requires that all amplifiers 16A–16D be operating to normal specification, with equal amplifier power and phase. In the event one of the amplifiers 16A–16D, should fail, the result will be a possible impedance mismatch at divider 14 and a power combining impedance mismatch at combiner 18. The resulting signal loss will exceed the ¼ power loss normally associated with the failed amplifier, because of the impedance mismatch at the combiner. In the event that one of amplifiers 16A–16D fails, or in the event that it is desired to disconnect one of the amplifiers 16A–16D, it is desirable to reconfigure power divider 14 and power combiner 18 to isolate the failed amplifier 16A–16D from the other elements of the system.

Figure 2:
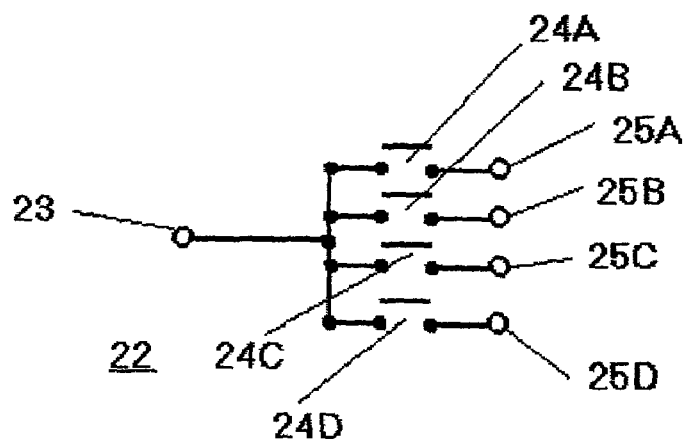
FIG. 2 is a schematic diagram of a single-pole four-throw RF switch.

FIG. 2 is a schematic diagram of a conventional single-pole, N-throw (N=4) RE switch 22 having a signal input port 23 and switch selectable output portions 25A, 25B, 25C and 25D. In normal applications the switch reeds 24A, 24B, 24D and 24D are moved to connect only one of the output ports 25A–25D to the input port 23. Because there is only a single connection at any time (except possibly during the switching process), assuming the load on the connected output port 25A–25D is equal to the characteristic impedance of the transmission line and source 23, impedance match is achieved.

If more than one of the output ports 25A–25D of switch 22 were connected, the input impedance at input port 23 will be a function of the impedance of all connected output ports. Accordingly, assuming that the output ports are SO ohm loads, and two output ports are connected, the impedance at input port 23 will be 25 ohms. If all switch reeds 24A–24D are moved to the connected position, and 50 ohm loads are provided at each output port, the impedance of input port 23 will be 12½ ohms. Accordingly, activation of more than one switch reed 24A–24D will normally cause a significant change in the input impedance, normally causing a mismatch and power loss by reflection.

Figure 3:
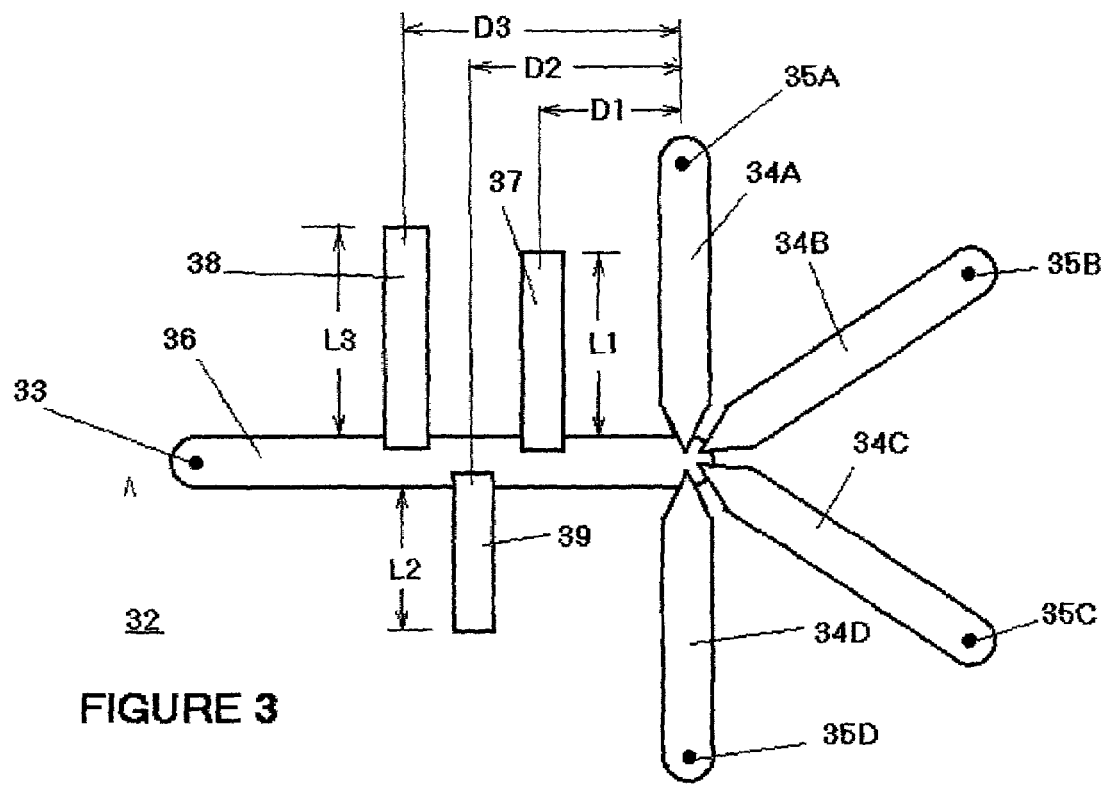
FIG. 3 is a plan view of the inner conductor arrangement of a switchable power divider in accordance with the present invention.

FIG. 3 is a plan top view of the inner conductor and reed portions of an RF signal divider 32 in accordance with a preferred embodiment of the present invention. The FIG. 3 drawing depicts the center conductor members of an RF switch assembly whose outer conductor is formed as an RF cavity 44 formed into a RF housing 42, as shown in perspective view in FIG. 4. FIG. 5 shows the inner conductors of FIG. 3 in place within cavity 44 of housing 42.

Figure 4:
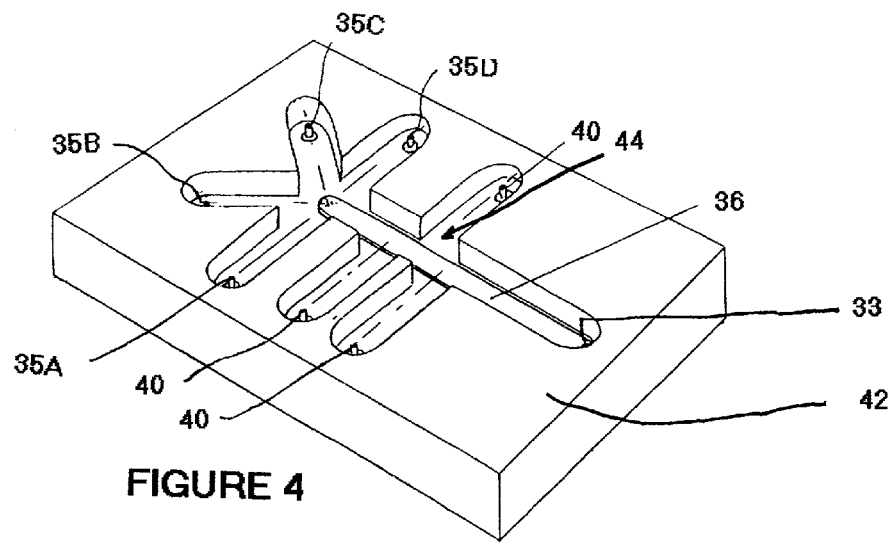
FIG. 4 is a perspective view of the RF cavity of a switchable power divider in accordance with a preferred embodiment of the invention for use with the inner conductor arrangement of FIG. 3.
Figure 5:
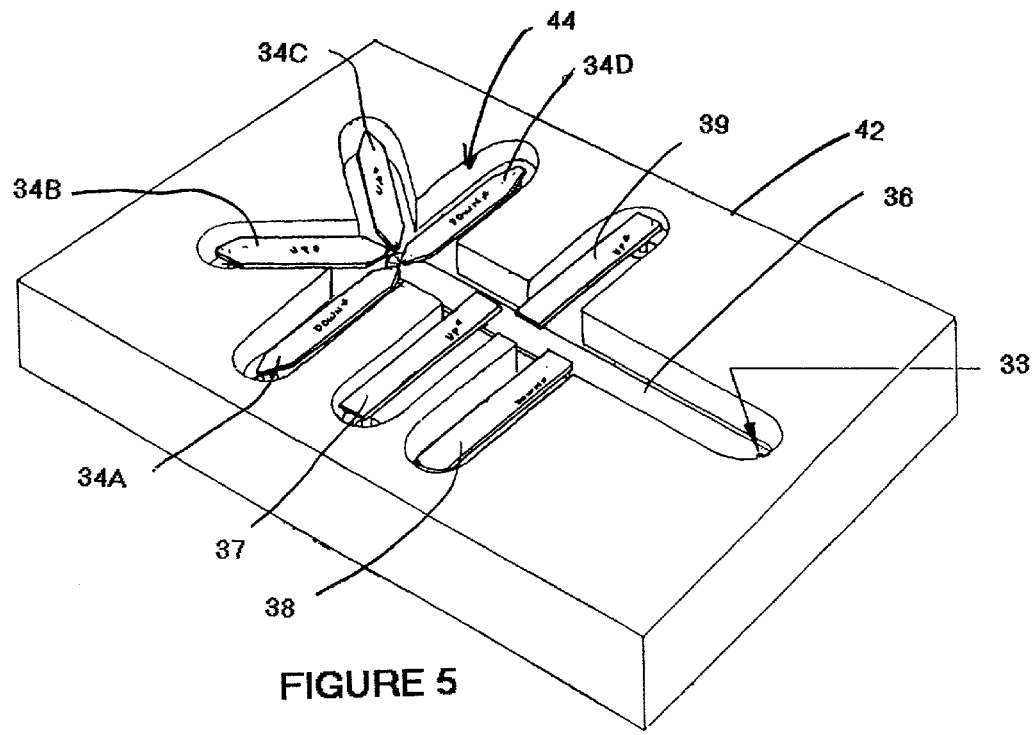
FIG. 5 is a perspective exposed view of the RF cavity assembly a preferred embodiment of a switchable RF power divider according to the present invention.

The inner conductor portions shown in FIG. 3 include a common input port 33, which is connected to a 50 ohm slab-line inner conductor 36 to be mounted within housing 42, as shown in FIGS. 4 and 5. Coaxial output ports 35A, 35B, 35C and 35D are selectively connectable to input port 33 via inner conductor 36 such that one or more of output ports 35A–35D can be coupled to input port 33. According to the number of output ports connected, an input signal provided to input port 33 is provided as an output signal to one or more output ports 35. Reeds 34A, 34B, 34C and 34D are mechanically moved between open or "off"_0 positions and closed or "on" positions by electromagnets in a conventional manner as will be further explained.

Those skilled in the art will recognize that when one of output ports 35A–35D is connected to input port 33 by one of switching reeds 34A–34D, the load presented to input port 33 is a match, i.e., 50 ohm, impedance load. As additional output ports 35 are connected by switching of their respective switch reeds 34A–34D, provisions must be made for impedance matching the input port 33 to the changed load condition.

Figure 6:
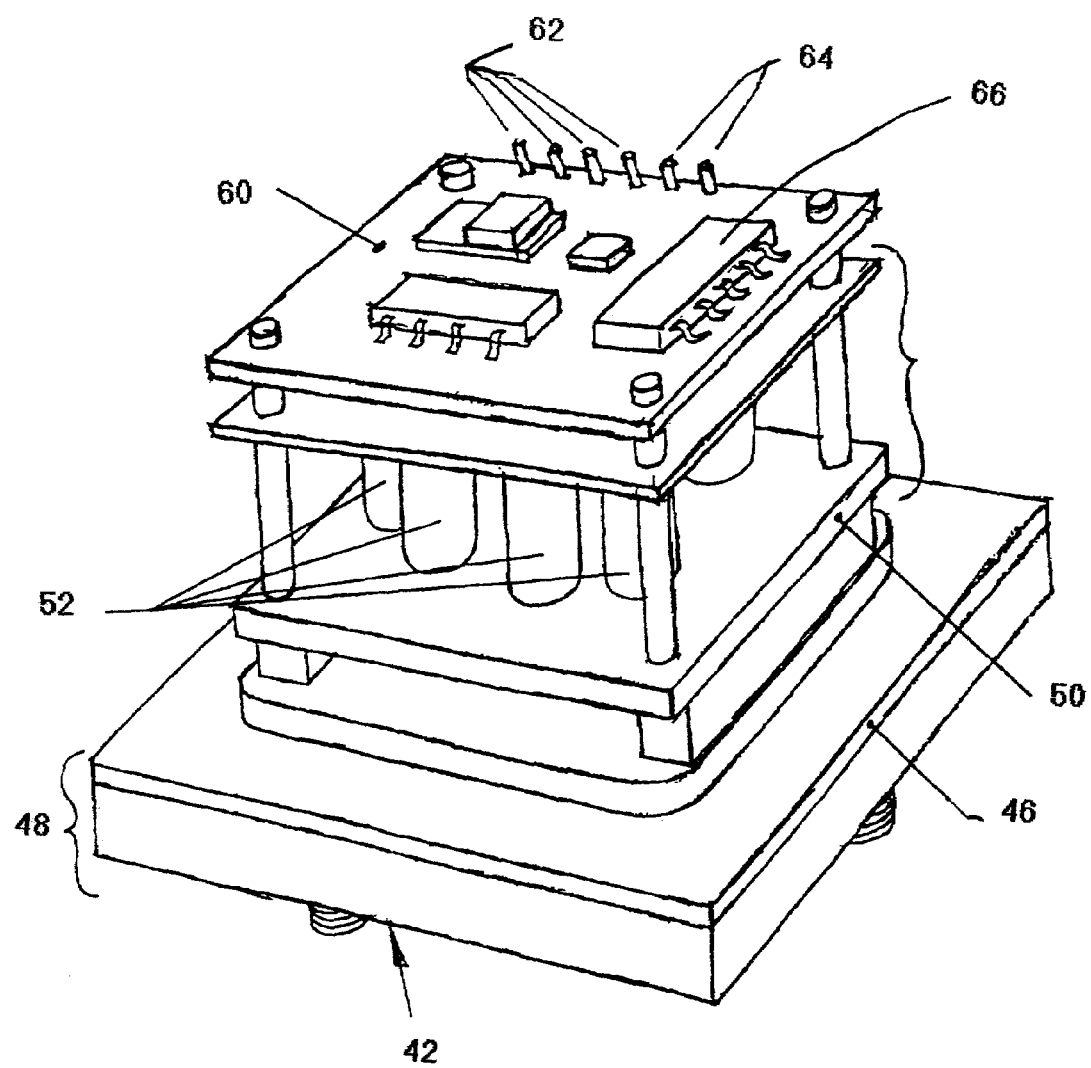
FIG. 6 is a perspective view of an assembly of a switchable RF power divider in accordance with the present invention.
Figure 7:
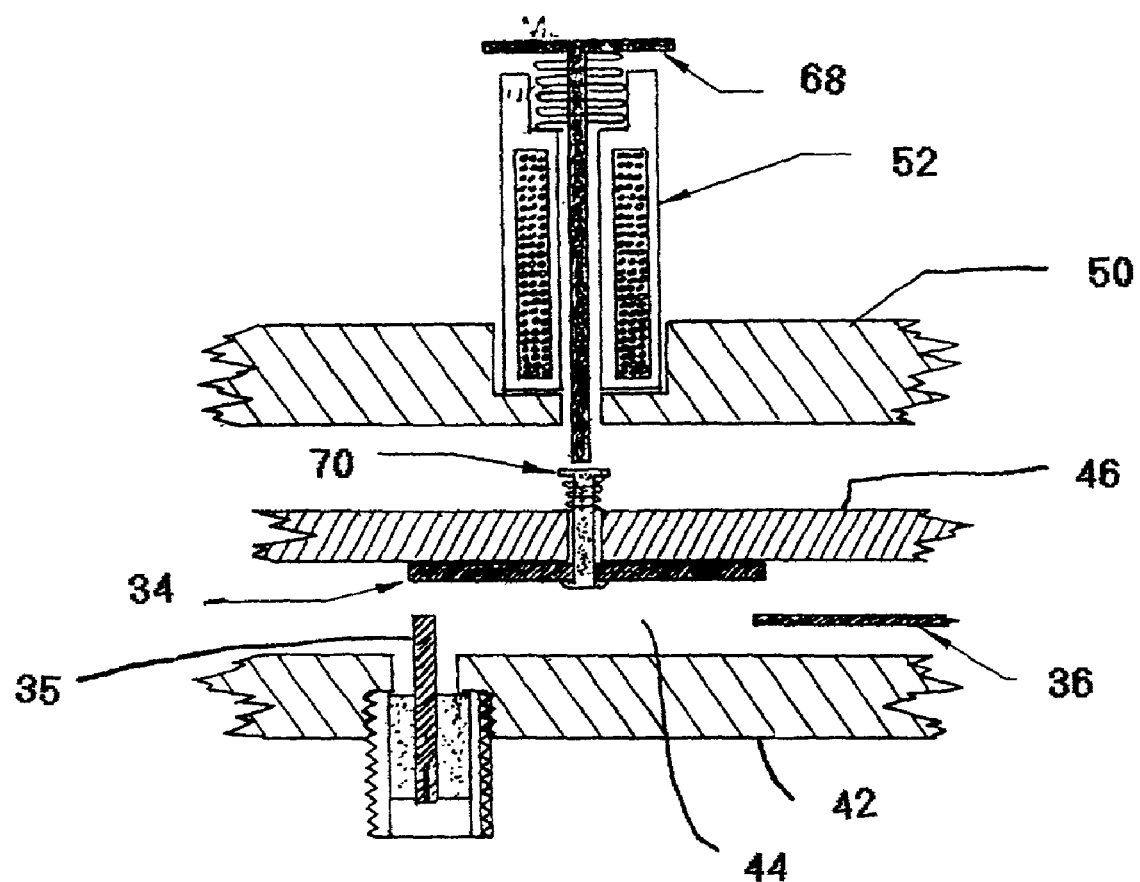
FIG. 7 is a cross-sectional view of a portion of the FIG. 6 power divider.

To provide for impedance matching, switchable matching stub reeds 37, 38 and 39 are respectively located at selected distances D1, D2 and D3 along slab transmission line 36 from the switching connection point. Each impedance matching reed 37, 38, and 39 has a respective impedance matching length L1, L2 and L3, which is selected to provide reactive impedance matching for the power divider when 2, 3 or 4 of output ports 35A–35D are connected to transmission line 36 by their respective switching reeds 34A–34D. In substantially the same manner as illustrated in FIGS. 6 and 7 with respect to switching reeds 34A–34D, solenoids 52 are arranged to move switchable matching reeds 37, 38 and 39 (FIG. 3) between a "down" position contacting center conductor 36 and mechanical rest 40 (FIG. 4) and an "up" position away from the center conductor 36.

In a representative embodiment arranged to operate at a frequency band of approximately 1805 to 1870 MHz dimensions D1, D2 and D3 and lengths L1, L2 and L3 are appropriately selected as follows:

| Any two outputs | D3 = .619" | L3 = .583" |
|---|---|---|
| Any three outputs | D2 = .523" | L2 = .833" |
| Any four outputs | D1 – .459" | L1 = .947" |

In the arrangement of FIG. 3 impedance matching reed 38 is activated when two output ports are connected, impedance matching reed 39 is activated when three ports are connected and impedance matching reed 37 is activated when four output ports are connected.

Reference is made to the perspective view of FIG. 6 and the cross-sectional view of FIG. 7, which illustrate a typical configuration for operation of reeds 34A–34D of the preferred embodiments of FIGS. 3 through 5. As shown in FIG. 6 and FIG. 7, RF housing 42 is provided with a cover plate 46 to provide an RF assembly 48 (FIG. 6) having an RF cavity 44 defined therein. A solenoid mounting plate 50 is secured to cover plate 46 and provided with solenoids 52 having armatures 68, which act on pin 70 carrying reeds 34 which engage terminal 35 and center conductor 36 for activating the switch (FIG. 7). The impedance matching reeds are similarly driven by solenoids. As best shown in FIG. 6, a circuit board 60 is conveniently mounted above solenoids 52, and includes integrated circuits 66 for providing driving currents in accordance with supplied logic signals representing the desired state of the power divider, provided to terminal 62, and using DC power supplied to terminals 64.

The cross-sectional view of FIG. 7 shows a solenoid 52 for driving an armature 68 in a downward direction in response to supplied current. Armature 68 engages nonconducting activating pin 70 to move reed 34 from the open switch position shown in FIG. 7 to a position connecting output terminal 35 to slab-line center conductor 36.

Figure 8:
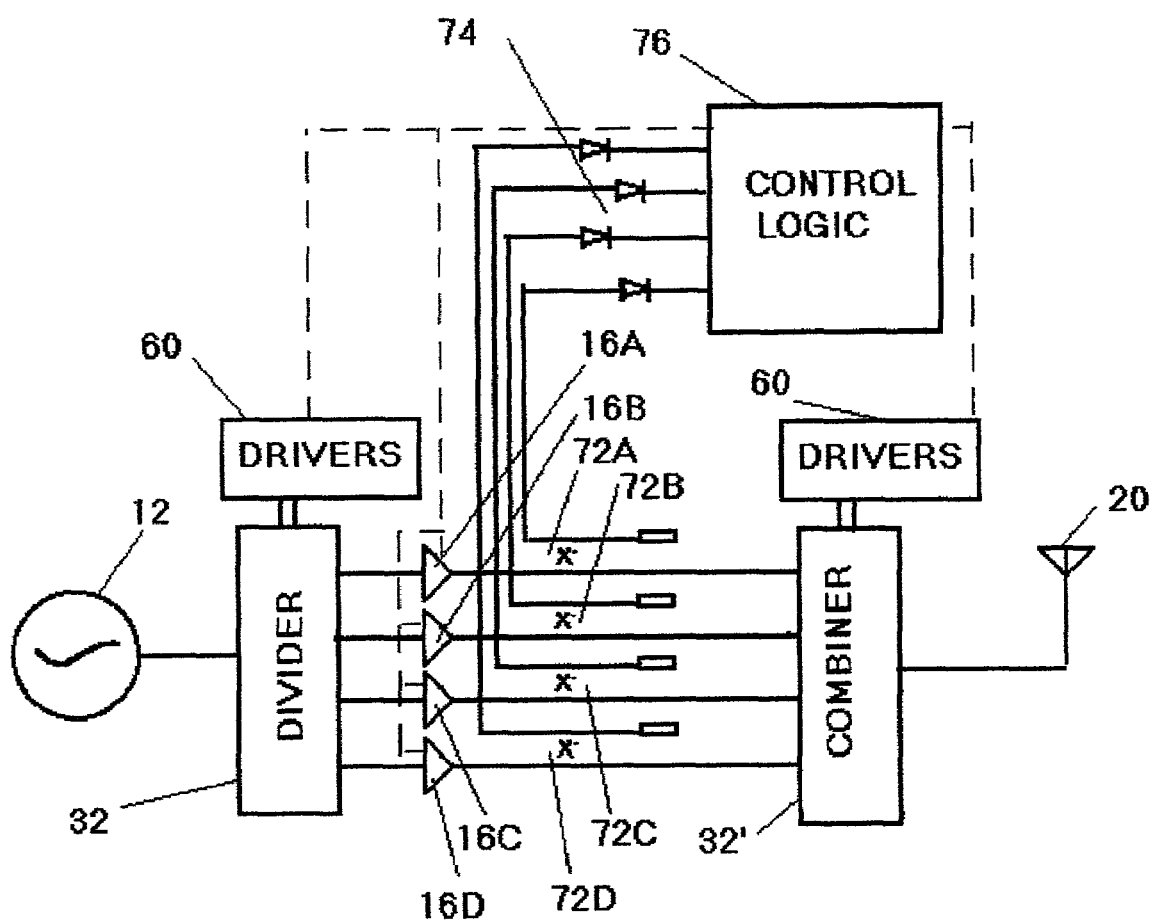
FIG. 8 is a block and schematic diagram of an RF amplifier using power dividers in accordance with the present invention.

Those skilled in the art will recognize that the switchable power divider of the present invention can be advantageously used in connection with a multiple solid state amplifier device as shown in FIG. 8. In connection with such amplifiers it is possible to provide a variable power output signal by selecting less than all of the four power amplifiers 16A, 16B, 16C and 16D for producing a combined output signal. In this case control logic 76 can control which of amplifiers 16A, 16B, 16C and 16D are to be activated and, accordingly, set the condition of divider 32 and combiner 32' using driver circuits 60. By control of the switching reeds 34 and the impedance matching reeds 37, 38 and 39, as shown in FIG. 3, the number of output signals from the divider 14 or input signals to combiner 18 can be varied, while maintaining impedance match.

As an additional feature, it is possible to provide a power amplifier system which will have a "fail soft" characteristic. Monitor couplers 72A, 72B, 72C and 72D are provided at the output of each individual amplifier 16A–16D, and the monitor signal is provided to detectors 74. Control logic 76 responds to a failure of any of amplifiers 16A–16D to discontinue operation of that amplifier, and reconfigure power divider 32 and power combiner 32' for operation with the remaining three amplifiers. Accordingly, the amplifiers continues to function with reduced power output.

While the present invention has been described with respect to a four-way power divider, those skilled in the art will recognize that the principles of the invention are applicable to N-way dividers and appropriate N–1 matching reads can be provided. In addition, those skilled in the art will recognize that a system of the type shown in FIG. 8 can be provided for normal operation with less than all of the amplifiers 16, for example three amplifiers, with the fourth amplifier being a stand by amplifier to be substituted in the event of a failure of one of the other units.

While there as been described what is believed to be the preferred embodiment of the invention, those skilled in the art will recognize that other and further modifications may be made thereto without departing from the spirit of the present invention, and it is intended to claim all such changes and modifications as fall within the true scope of the invention.

We claim:

1. An RF signal divider, comprising a single-pole, N-way RF switch, where N is an integer of 3 or more, said switch being operable to connect up to N individual RF ports to a center conductor connected to a common port, and a switched reactive impedance matching network having at least N−1 switch-selectable lossless matching elements arranged to connect to said center conductor, said impedance matching network being arranged to provide selected impedance matching for said N-way RF switch according to the number of said N individual ports that are connected to said common port by said switch.

2. An RF signal divider responsive to supplied control signals and operative to connect up to N individual RF ports to a common port, where N is an integer of 3 or more, in response to supplied control signals, said divider comprising:
- a single pole, N-way RF switch for selectively connecting said N individual ports to a center conductor connected to said common port in response to switch drive signals;
- a switchable reactive matching network having N−1 switch-selectable lossless matching elements operative to be connected to said center conductor of said RF switch in response to matching element drive signals; and
- a driver circuit responsive to said control signals for providing said switch drive signals and for providing said matching element drive signals accordingly to the number of said N individual ports designated to be connected by said control signals.

3. An RF signal divider comprising:
- a plurality of N individual ports, where N is an integer of 3 or more, each having an inner conductor contact terminal extending into an RF switch cavity;
- an RF common port;
- a planar inner conductor in said switch cavity, connected to said RF common port at one end and having a switch contact at a second end;
- a plurality of N switch reeds each moveable by an electro-magnet between a first position contacting said planar inner conductor and a second position spaced from said inner conductor; and
- a switchable reactive impedance matching network, comprising N−1 lossless impedance matching reeds moveable by an electromagnet between a first position contacting said planar conductor and a second position spaced from said planar conductor.

* * * * *